(12) United States Patent
Colijn (10) Patent No.: US 10,086,460 B2
(45) Date of Patent: Oct. 2, 2018

(54) SOLDERING MODULE (71) Applicant: Illinois Tool Works Inc., Glenview, IL (US)

(72) Inventor: Antonie Cornelis Colijn, HZ Nieuwendijk (NL)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 15/320,351

(22) PCT Filed: Jul. 24, 2015

(86) PCT No.: PCT/US2015/042021
§ 371 (c)(1),
(2) Date: Dec. 20, 2016

(87) PCT Pub. No.: WO2016/018759
PCT Pub. Date: Feb. 4, 2016

(65) Prior Publication Data
US 2017/0209949 A1 Jul. 27, 2017

(30) Foreign Application Priority Data

Jul. 29, 2014 (DE) ........................ 10 2014 110 720

(51) Int. Cl.
*B23K 37/00* (2006.01)
*B23K 3/06* (2006.01)
*B23K 1/08* (2006.01)

(52) U.S. Cl.
CPC ............ *B23K 3/0653* (2013.01); *B23K 1/085* (2013.01); *B23K 3/0676* (2013.01)

(58) Field of Classification Search
CPC .... B23K 3/0653; B23K 1/085; B23K 3/0676; H05K 3/34
(Continued)

(56) References Cited

U.S. PATENT DOCUMENTS 3,713,876 A * 1/1973 Lavric .................... B23K 1/085
118/423
4,527,731 A 7/1985 Kent et al.
(Continued)

FOREIGN PATENT DOCUMENTS

CN 1124470 A 6/1996
CN 102361720 A 2/2012
(Continued)

OTHER PUBLICATIONS

Translation of EP-1733833A1 (no date available).*
(Continued)

*Primary Examiner* — Kiley S Stoner
(74) *Attorney, Agent, or Firm* — Lando & Anastasi, LLP (57) ABSTRACT

The invention relates to a soldering module (3) for the, in particular selective, soldering of components to a circuit board (14), having a soldering nozzle (32) for creating a solder wave. It is proposed that the soldering module (3) comprises a linear conveyor (8), in particular a belt conveyor or a chain conveyor, for applying solder to the circuit board (14) by moving the circuit board (14) in a conveying direction over the solder wave, and that the linear conveyor (8) is tiltable, in particular about a first tilting axis (23).

15 Claims, 8 Drawing Sheets

(58) Field of Classification Search
USPC .............. 228/260–261, 33, 37, 56.1, 43
See application file for complete search history.

(56) References Cited

U.S. PATENT DOCUMENTS

| | | | | |
|---|---|---|---|---|
| 4,616,775 A * | 10/1986 | Simonetti | ............ | B23K 3/0676 228/37 |
| 4,632,291 A * | 12/1986 | Rahn | .............. | B23K 1/085 219/388 |
| 4,684,056 A * | 8/1987 | Deambrosio | ........ | B23K 3/0653 228/180.1 |
| 4,775,776 A * | 10/1988 | Rahn | .............. | B23K 1/085 219/388 |
| 4,921,156 A * | 5/1990 | Hohnerlein | ............ | B23K 1/008 228/105 |
| 5,048,746 A * | 9/1991 | Elliott | ............ | B23K 1/008 228/180.1 |
| 5,240,169 A * | 8/1993 | Gileta | .............. | B23K 1/085 228/180.1 |
| 5,368,222 A * | 11/1994 | Scorta | ............ | B23K 3/0653 228/180.1 |
| 5,409,159 A | 4/1995 | Connors et al. | | |
| 5,492,265 A * | 2/1996 | Wandke | ............ | B23K 1/0016 228/205 |
| 5,630,542 A * | 5/1997 | Hendrikx | ............ | B23K 3/0653 118/429 |
| 6,164,516 A * | 12/2000 | Watanabe | ............ | B23K 1/085 228/31 |
| 6,168,065 B1 * | 1/2001 | Willemen | ............ | B23K 1/018 228/20.1 |
| 6,364,195 B1 * | 4/2002 | Masuda | ............ | B23K 3/0653 228/37 |
| 6,367,677 B1 * | 4/2002 | Hildenbrand | .......... | B23K 1/085 228/37 |
| 6,676,890 B2 * | 1/2004 | Chaleat | ............ | B01J 2/04 222/593 |
| 8,590,765 B2 | 11/2013 | Yoshino et al. | | |
| 2001/0020637 A1 * | 9/2001 | Zen | .............. | B23K 1/085 228/260 |
| 2002/0011511 A1 * | 1/2002 | Takahashi | ............ | B23K 1/085 228/223 |
| 2002/0014513 A1 * | 2/2002 | Baker | ............ | B23K 1/0016 228/37 |
| 2002/0036223 A1 * | 3/2002 | Saito | ............ | B23K 3/0653 228/37 |
| 2002/0179693 A1 * | 12/2002 | Kawashima | .......... | B23K 1/0016 228/232 |
| 2003/0116352 A1 * | 6/2003 | Nakatsuka | .......... | B23K 3/0653 174/263 |
| 2003/0168499 A1 * | 9/2003 | Tanabe | ............ | B23K 1/085 228/260 |
| 2004/0211816 A1 * | 10/2004 | Ogawa | ............ | B23K 1/085 228/37 |
| 2005/0061850 A1 | 3/2005 | Buley et al. | | |
| 2005/0067464 A1 * | 3/2005 | Wang | ............ | B23K 1/085 228/49.5 |
| 2006/0043154 A1 * | 3/2006 | Kirby | ............ | B23K 1/0016 228/37 |
| 2006/0186183 A1 * | 8/2006 | Morris | ............ | B23K 1/0016 228/260 |
| 2006/0191976 A1 * | 8/2006 | Kaneko | ............ | B23K 3/0653 228/36 |
| 2007/0051777 A1 | 3/2007 | Yamaguchi et al. | | |
| 2008/0302861 A1 * | 12/2008 | Szymanowski | ...... | B23K 3/0653 228/223 |
| 2009/0236402 A1 * | 9/2009 | Willenegger | .......... | B23K 1/008 228/45 |
| 2010/0059575 A1 | 3/2010 | Isler et al. | | |
| 2010/0264197 A1 * | 10/2010 | Aoyama | .................. | B23K 1/08 228/219 |
| 2011/0226843 A1 * | 9/2011 | Yanaros | ............... | B23K 1/085 228/260 |
| 2012/0193400 A1 * | 8/2012 | Hsieh | ................... | H05K 3/3447 228/102 |
| 2013/0211579 A1 * | 8/2013 | Kalayjian | ............. | B23K 3/0653 700/212 |
| 2014/0209661 A1 * | 7/2014 | Hsieh | ................... | B23K 3/0653 228/37 |
| 2015/0208515 A1 * | 7/2015 | Dautenhahn | ........... | H05K 3/306 228/6.2 |
| 2015/0216092 A1 * | 7/2015 | Dautenhahn | ....... | H05K 13/0465 228/234.1 |
| 2015/0245499 A1 * | 8/2015 | Dautenhahn | ........... | H05K 3/341 228/37 |
| 2015/0298233 A1 * | 10/2015 | Dreikorn | ............... | B23K 1/0016 228/102 |
| 2016/0052074 A1 * | 2/2016 | Hueste | ................ | B23K 1/0016 228/219 |

FOREIGN PATENT DOCUMENTS

| | | | | |
|---|---|---|---|---|
| DE | 4209133 A1 | 9/1993 | | |
| DE | 102007002777 A1 | 7/2008 | | |
| EP | 1733833 A1 | 12/2006 | | |
| FR | 2298203 A1 | 8/1976 | | |
| FR | 2572971 A1 * | 5/1986 | .......... | B23K 3/0676 |
| FR | 2587256 A1 * | 3/1987 | .......... | B23K 3/0653 |
| FR | 2587257 A1 * | 3/1987 | .......... | B23K 3/0653 |
| GB | 2418881 A * | 4/2006 | .......... | B23K 3/0653 |
| JP | 55976660 A | 5/1984 | | |
| JP | H05267838 A | 10/1993 | | |
| JP | 2004358498 A | 12/2004 | | |
| JP | 2005236000 A | 9/2005 | | |
| KR | 20000051777 A | 8/2000 | | |
| WO | 2009027651 A1 | 3/2009 | | |

OTHER PUBLICATIONS

Notification of Transmittal of the International Search Report and the Written Opinion of the International Searching Authority from corresponding PCT/US2015/042021 dated Nov. 20, 2015.

* cited by examiner

SOLDERING MODULE

CROSS-REFERENCE TO RELATED APPLICATIONS

This application is a U.S. National Stage Application under 35 U.S.C. § 371 of International Application No. PCT/US2015/042021, filed Jul. 24, 2015, titled SOLDERING MODULE, which claims priority to German Patent Application No. 102014110720.9 filed Jul. 29, 2014. These prior applications are incorporated by reference herein in their entirety.

The present invention relates to a soldering module for soldering components to a circuit board, to a soldering plant comprising same, and to a method for soldering components to a circuit board.

Various methods have been established for the automated soldering of components to circuit boards, also known as printed circuit boards. These include the reflow soldering method and the wave soldering method. A variant of the wave soldering method is the selective soldering method.

In selective soldering, liquid solder is passed through a soldering nozzle such that a solder wave forms on the top side of the soldering nozzle. Typically, the soldering nozzle is arranged in a solder bath so that the solder emerging from the soldering nozzle can run off back into the solder bath. In the solder bath, the solder can then be reheated and passed through the soldering nozzle by means of a pump.

Depending on the circuit board layout, the circuit board to be populated with the components to be soldered is guided over the solder wave or the solder wave is guided along under the circuit board. An example of a selective soldering plant is described in DE 10 2007 002 777 A1. Typically, the circuit board is moved over the solder wave at a particular previously defined angle in the wave soldering method, in order to set the quantity of solder adhering to the circuit board. The angle selected only ever represents a compromise in this case with regard to the requirements of the individual components.

Against this background, the present invention is based on the problem of specifying a soldering module, a soldering plant and a method, which allow greater consideration to be given to the soldering properties of the individual components.

According to the invention, the above problem is solved by a soldering module as claimed in claim 1, a soldering plant as claimed in claim 12 and a soldering method as claimed in claim 15.

With regard to the soldering module, the abovementioned problem is solved by a soldering module for the, in particular selective, soldering of components to a circuit board, having a soldering nozzle for creating a solder wave, wherein the soldering module comprises a linear conveyor, in particular a belt conveyor or a chain conveyor, for applying solder to the circuit board by moving the circuit board in a conveying direction over the solder wave, and the linear conveyor is tiltable.

A first configuration of the soldering module provides for the linear conveyor to be tiltable about a first tilting axis, wherein preferably the normal of the circuit board encloses an angle of at least 4°, preferably of at least 8°, more preferably of at least 10°, with the direction of gravitational force. Tilting of the circuit board through an angle of at least 4° can ensure application to the circuit board of a quantity of solder that is favorable for most applications. An angle of at least 8° can prove favorable when the quantity of solder sticking to the component and/or the time for which hot, excess solder is in heat-conducting contact with the component is intended to be reduced in order to reduce the thermal load on the component during soldering.

According to a further exemplary embodiment, the first tilting axis is oriented substantially perpendicularly to the conveying direction or substantially parallel to the conveying direction. The orientation of the first tilting axis substantially perpendicularly to the conveying direction or substantially parallel to the conveying direction can simplify the construction of the soldering module.

Furthermore, according to one development of the soldering module, the linear conveyor is tiltable about a second tilting axis, wherein the second tilting axis is oriented substantially normal to the direction of gravitational force. As a result of provision being made of a second tilting axis, which is oriented substantially normal to the direction of gravitational force, the soldering result can be adapted better to the specified circuit board layout.

Another configuration provides for the first tilting axis and/or the second tilting axis to extend through the solder wave. When the first and/or the second tilting axis extends or extend through the solder wave, the linear conveyor can be tilted without the distance between the soldering nozzle and the linear conveyor having to be set anew.

According to a further exemplary embodiment of the soldering module, the linear conveyor is tiltable while the circuit board is being moved over the solder wave. Tiltability of the linear conveyor while the circuit board is being moved can reduce the throughput time of the circuit board through the soldering module.

Furthermore, according to one development of the soldering module, the soldering nozzle is movable in a plane oriented substantially normal to the direction of gravitational force. The movability of the soldering nozzle in a plane oriented substantially normal to the direction of gravitational force can make it possible to solder components to the circuit board selectively at different points. The travel parallel and/or transversely to the conveying direction can be in particular 400 mm to 450 mm.

Another configuration of the soldering module provides for the distance between the soldering nozzle and the circuit board to be settable by moving the soldering nozzle. Settability of the distance between the soldering nozzle and circuit board can make it possible in particular to solder components fastened to the underside of the circuit board that have different component heights.

According to a further exemplary embodiment of the soldering module, the soldering nozzle is rotatable. A rotatable, and in particular non-rotationally symmetric, soldering nozzle can be adapted for example to the orientation of the tilting axis. Furthermore, by way of the continuous rotation of the soldering nozzle, the risk of depositions of solder on the soldering nozzle can be reduced.

Furthermore, according to one development, the soldering nozzle is wettable with solder, and in particular is manufactured from steel. When a wettable soldering nozzle is used, the process conditions at the solder joint can be independent of the transport direction of the components to be soldered with respect to the soldering nozzle. Soldering nozzles manufactured from simple steel are additionally available on the market at particularly low cost.

Another configuration of the soldering module provides for the soldering nozzle not to be wettable with solder, and to be manufactured in particular from a stainless, in particular coated, steel. If a soldering nozzle that is not wettable with solder is used, the solder can run off on the rear side of the component. A non-wettable soldering nozzle can be manufactured in particular from a coated, stainless steel.

According to a further exemplary embodiment, the soldering module has an inert gas device. When the solder is heated, dross can form. As a result of inert gas being used, the extent of oxidation at the surface of the solder bath and thus the formation of dross can be reduced.

Furthermore, according to one development of the soldering module, provision is made of a solder joint processing device, wherein the solder joint processing device comprises a gas nozzle. By way of the gas nozzle, gas, in particular an inert gas, for example nitrogen, can be blown onto the solder joint with the result that the run-off direction of the solder is defined better. In this way, the occurrence of undesired solder bridges between solder joints can be avoided.

Another configuration of the soldering module can provide for the soldering module to have a second soldering nozzle for creating a second solder wave. By way of the second soldering nozzle, in particular the throughput time of the circuit board through the soldering module can be reduced, since components can be soldered simultaneously at a number of points on the circuit board. However, the second soldering nozzle can also be used to apply a different solder, which is particularly well adapted to the respective components to be soldered. It is likewise conceivable to provide a wettable soldering nozzle as the first soldering nozzle and a non-wettable soldering nozzle as the second soldering nozzle.

With regard to the soldering plant, the abovementioned object is achieved in that the soldering plant has a first soldering module, as has been described above, and a flux module. The combination of a flux module with a soldering module can shorten the processing time. In particular, the flux module and soldering module can be configured to automatically transfer the populated circuit boards.

A first configuration of the soldering plant provides for the soldering plant to have a preheating module. A preheating module can serve to activate the flux applied to a populated circuit board. Likewise, the circuit board and the components attached thereto can be heated by the preheating module. The temperature difference between the circuit board and the components attached to one side thereof and the liquid solder can thus be reduced. Therefore, better adhesion of the solder to the components and the circuit board can be achieved. In addition, the risk of damage to the components on account of thermal stresses is reduced. A flux module and a preheating module can also be combined in a preparation module. Thus, provision can be made in particular of a common linear conveyor, with the result that the costs can be reduced compared with individual modules. Individual modules can, by contrast, increase the flexibility.

According to a further exemplary embodiment, the soldering plant has a second soldering module, with the result that for example the throughput can be increased. It is likewise conceivable for a different soldering nozzle and/or a different solder to be used in the second soldering module. The advantages associated therewith are described above.

With regard to the method for soldering components to a circuit board, the abovementioned object is achieved according to the invention in that a populated circuit board is received on a linear conveyor, wherein the linear conveyor is in a receiving position, in that the linear conveyor is tilted into a first processing position, in that the circuit board is moved over a first solder wave by means of the linear conveyor, wherein a subregion of the circuit board is wetted with solder, in that the linear conveyor is tilted into a transfer position, and in that the circuit board is transferred in the transfer position of the linear conveyor.

By way of the method as proposed, in particular soldering modules for selective soldering and corresponding soldering plants can be integrated into existing production plants without the circuit boards having to be transferred manually. Furthermore, a greater degree of automation can also be ensured in the production of more complex, individual circuit configurations. In the method, in particular soldering module as described above and/or a soldering plant as explained above can be used.

The invention is explained in the following text by way of figures. In the drawing, by way of example.

Figure 1:
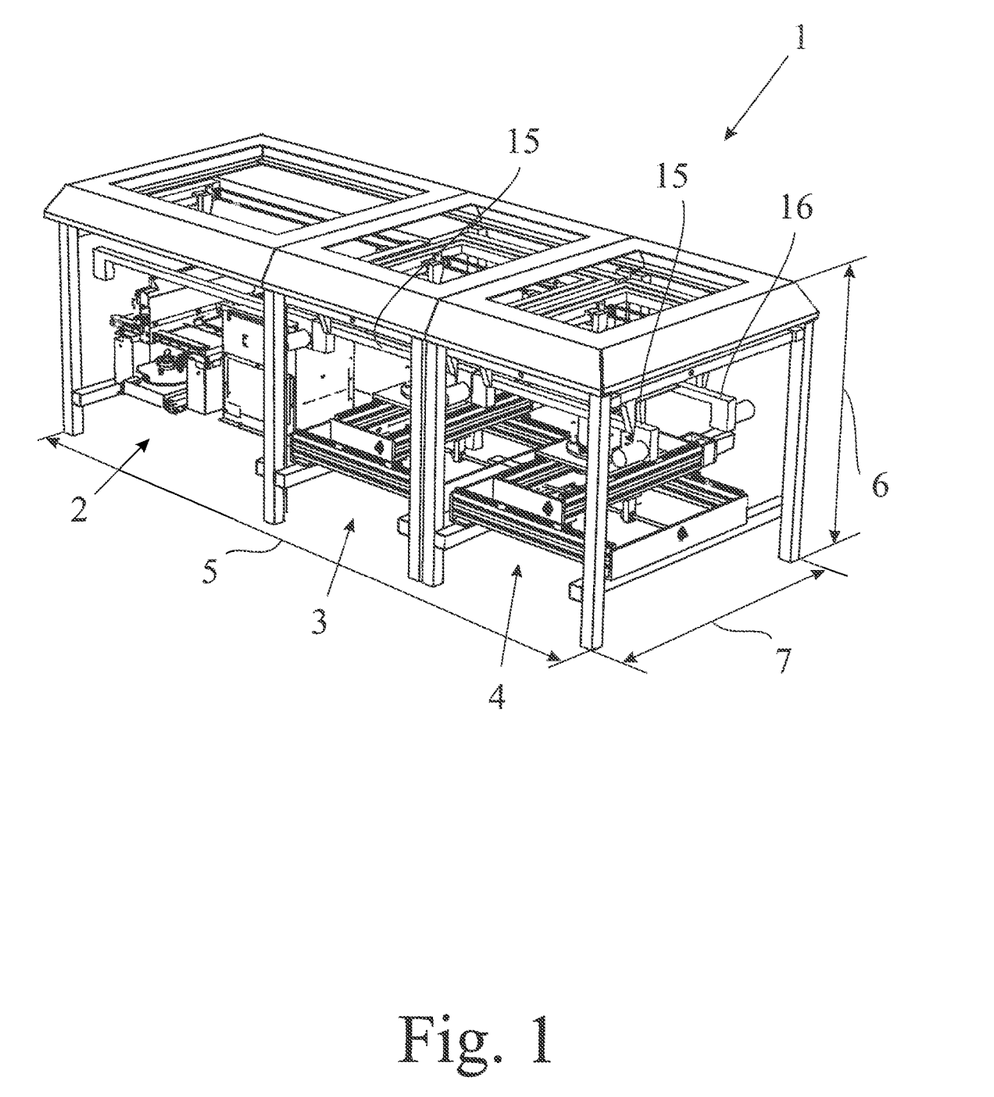
FIG. 1 shows a perspective view of a first embodiment of a soldering plant as proposed.

The soldering plant 1 shown in FIG. 1 has a preparation module 2, a first soldering module 3 and a second soldering module 4. A circuit board 14 (not illustrated) that is already populated with components is first of all provided with flux in the preparation module 2. Subsequently, in the preparation module 3, the flux is activated by the action of heat on the circuit board 14 and at the same time sufficient thermal energy is introduced into the circuit board 14 and the components for a good soldering result. Subsequently, the circuit board 14 is transferred from the preparation module 2 to the first soldering module 3. By way of the first soldering module 3, for example a first group of components can be soldered to the circuit board 14. Following the first soldering module 3, a second soldering module 4 is provided.

By way of the second soldering module 4, a further group of components can be soldered to the circuit board 14. The second soldering module 4 can differ from the first soldering module for example by way of the type of solder used. It is likewise conceivable for a different soldering nozzle 37 to be used in the second soldering module 4, it being possible for said different soldering nozzle 37 to differ from the soldering nozzle of the first soldering module 4 for example in terms of its diameter or shape and thus to be more suitable for smaller (or larger) components. It is likewise conceivable to use two identical soldering modules 3 and 4 only in order to increase the number of cycles.

Figure 2:
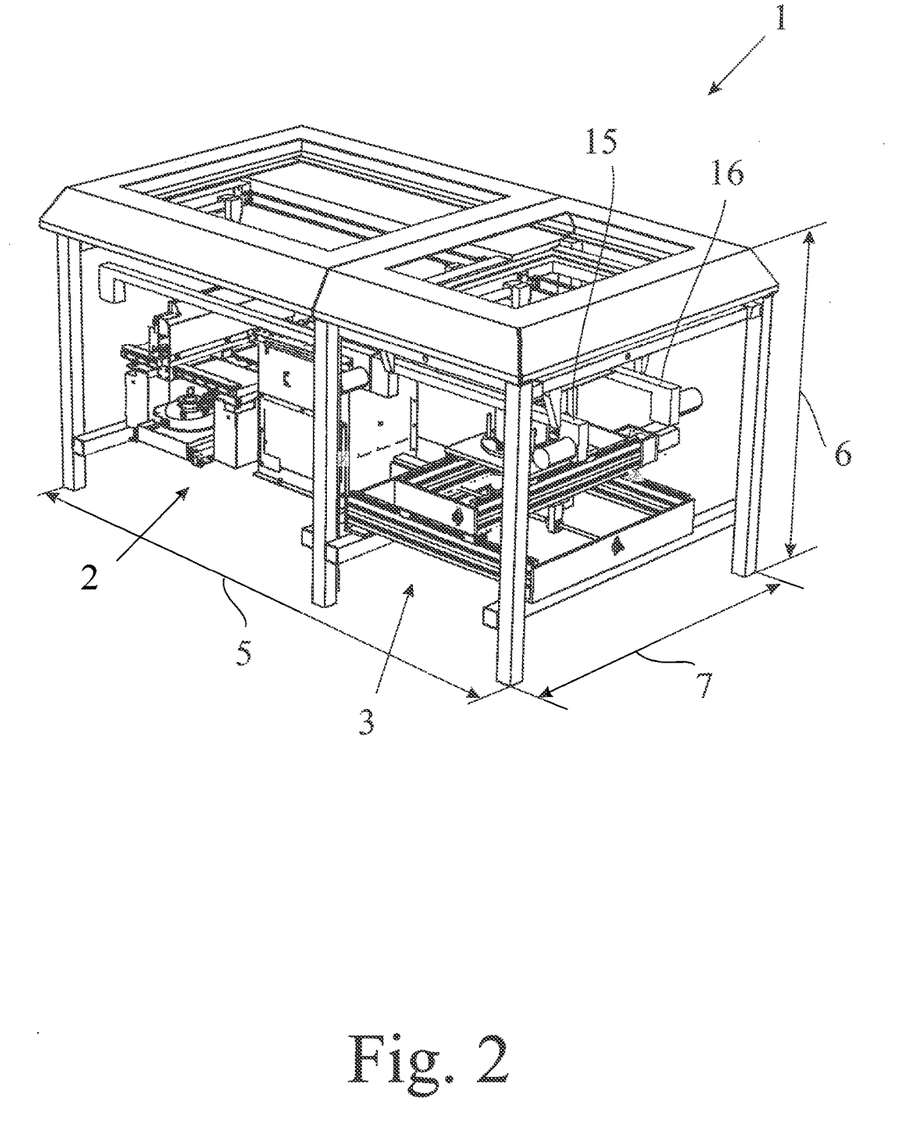
FIG. 2 shows a perspective view of a second embodiment of a soldering plant as proposed.

In contrast to the soldering plant 1 according to FIG. 1, in the case of the soldering plant 1 illustrated in FIG. 2, only a soldering module 3 is provided after the preparation module 2. The soldering plant 1 can be made available more conveniently as a result. By way of the modular construction, further soldering modules can be added with little effort. The soldering plant 1 can thus be adapted cost-effectively to the particular manufacturing requirements and does not have to be replaced in its entirety.

Figure 3:
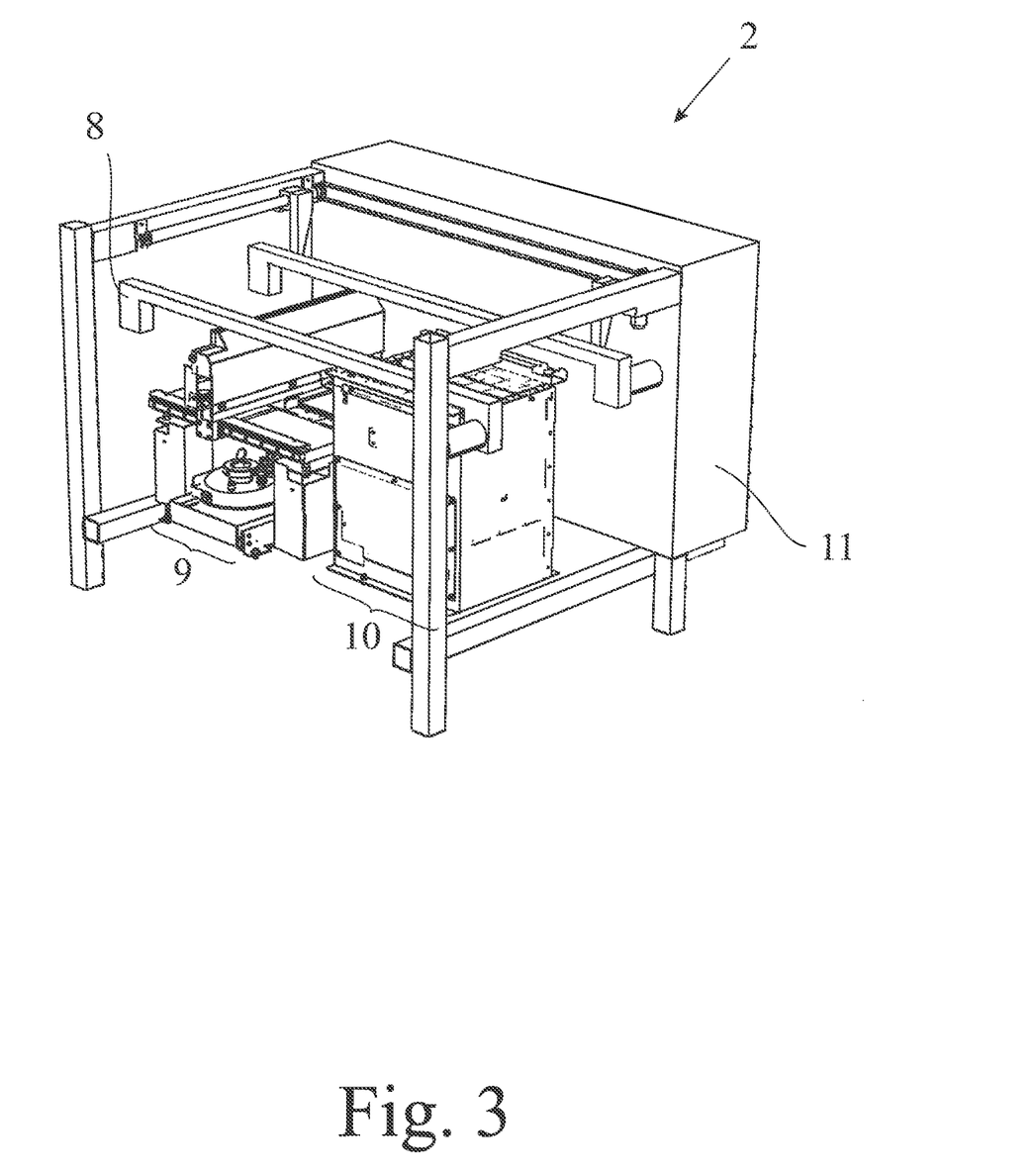
FIG. 3 shows a preparation module of a soldering plant as proposed.

FIG. 3 illustrates a preparation module 2 as can be used in a soldering plant according to FIG. 1 or FIG. 2. The preparation module 2 comprises a linear conveyor 8 by way of which a circuit board 14 can be transported through the preparation module. Also provided is a flux module 9 by way of which flux can be applied to those points of the populated circuit board that are to be wetted with solder. The flux module 9 is followed by a preheating module 10. By means of the preheating module 10, the flux applied to the populated circuit board 14 can be activated. In addition, the circuit board 14 and the components can be brought to a temperature which allows a particularly good mechanical and electrical connection to the solder to be applied. The preparation module can also comprise a control unit 11 by way of which the linear conveyor 8, the flux module 9 and the preheating module 10 can be controlled. Provision can also be made for the control unit 11 also to control further modules to be connected to the preparation module 10, in particular soldering modules.

Figure 4:
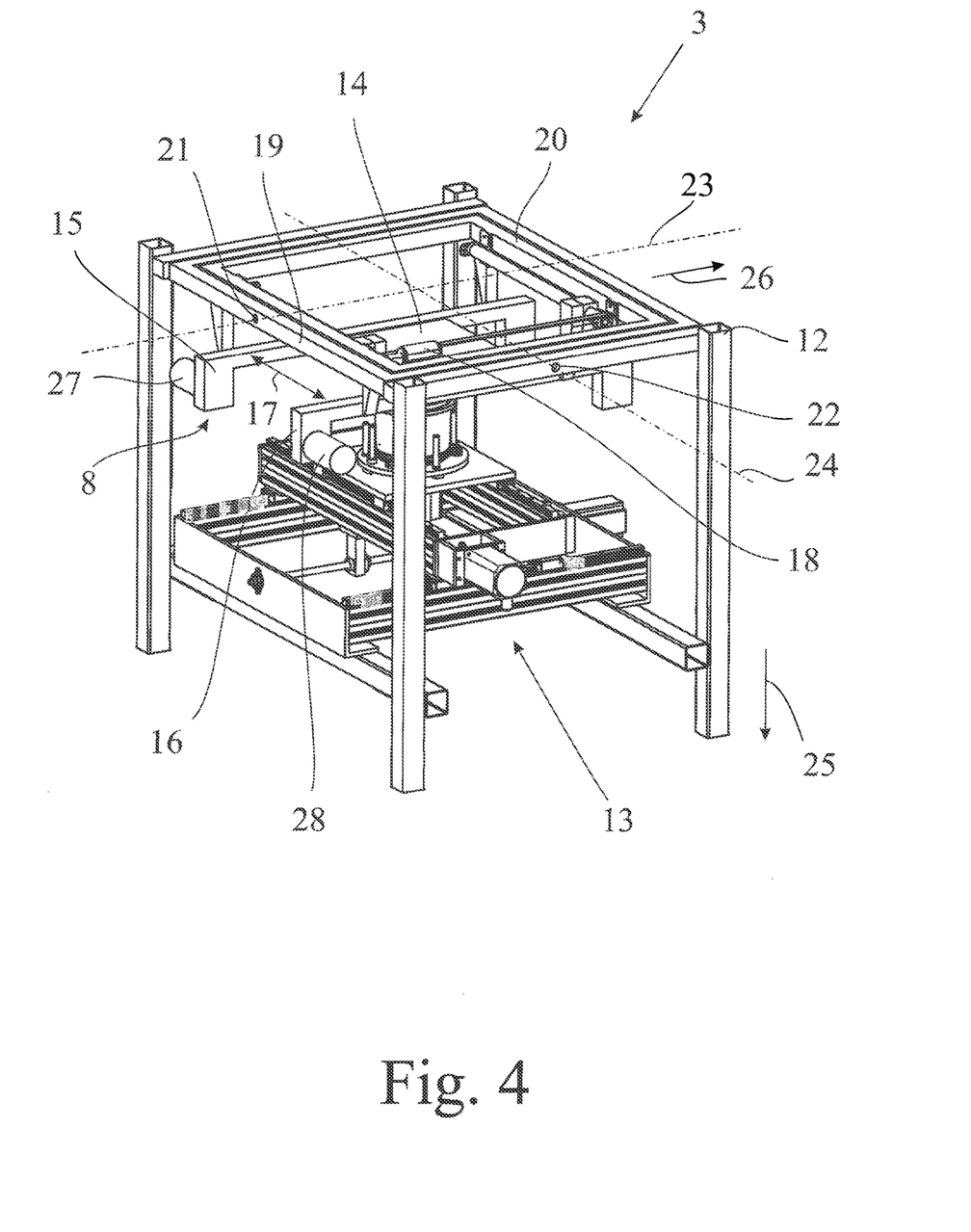
FIG. 4 shows a soldering module of a soldering plant as proposed.

The soldering module 3 illustrated in FIG. 4 has a soldering module frame 12, in which a soldering unit 13 and a linear conveyor 8 are fastened. By way of the linear conveyor 8, a circuit board 14 can be moved over a solder wave that is generated by a soldering nozzle 37 (not visible in FIG. 4) which is covered by the soldering module frame 12 and which is part of the soldering unit 13. The linear conveyor 8 has two guides 15 and 16 by way of which the circuit board 14 is laterally guided. In order to move the circuit board 14, provision is also made of two drives 27 and 28. The distance 17 between the two guides 15 and 16 can be changed by means of a motor 18 in order to take into account different circuit board sizes. The linear conveyor 8 is suspended in a gimbaled manner via two linear conveyor frames 19 and 20 in the soldering module frame 12 and via bearings 21 and 22.

Via motors (not illustrated in FIG. 4), the linear conveyor can be tilted about a first tilting axis 23 and a second tilting axis 24. The first tilting axis 23 and the second tilting axis 24 are each oriented perpendicularly to the direction of gravitational force. In addition, the first tilting axis 23 is arranged parallel to the conveying direction 26 and the second tilting axis 24 perpendicularly to the conveying direction 26 in which the circuit board 14 is moved.

Figure 5:
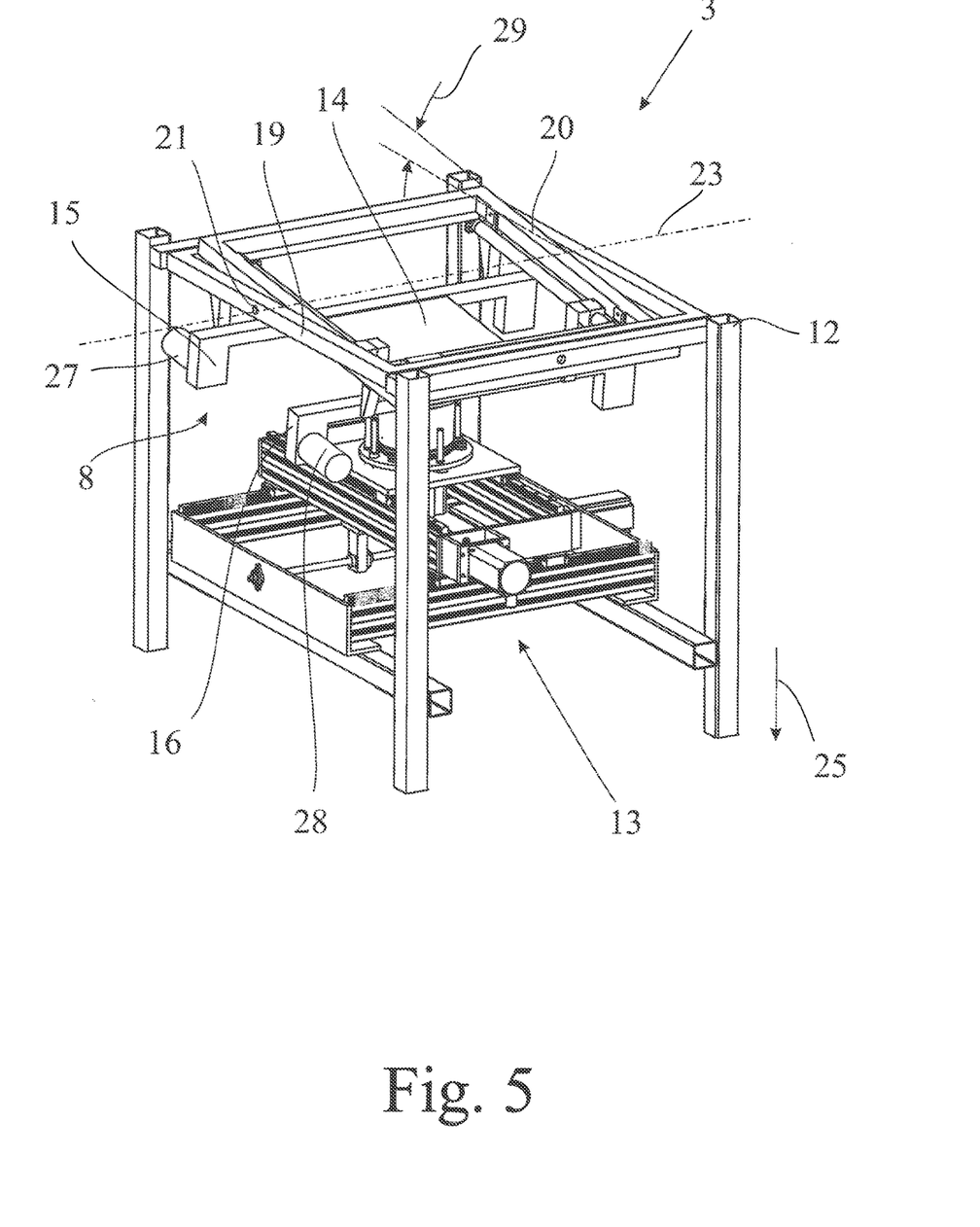
FIG. 5 shows the soldering module according to FIG. 4 in a first tilted position of the linear conveyor.

FIG. 5 likewise illustrates the soldering module 3 according to FIG. 4. As in FIG. 4, the soldering module 3 comprises a soldering module frame 12, a soldering unit 13 and a linear conveyor 8. In contrast to the soldering module 3 depicted in FIG. 4, the linear conveyor 8 has been tilted through an angle 29 about a first tilting axis 23 such that the normal of the circuit board 14 and the direction of gravitational force enclose an angle of 7°. The first tilting axis is in this case oriented perpendicularly to the direction of gravitational force 25 and parallel to the conveying direction 26.

Figure 6:
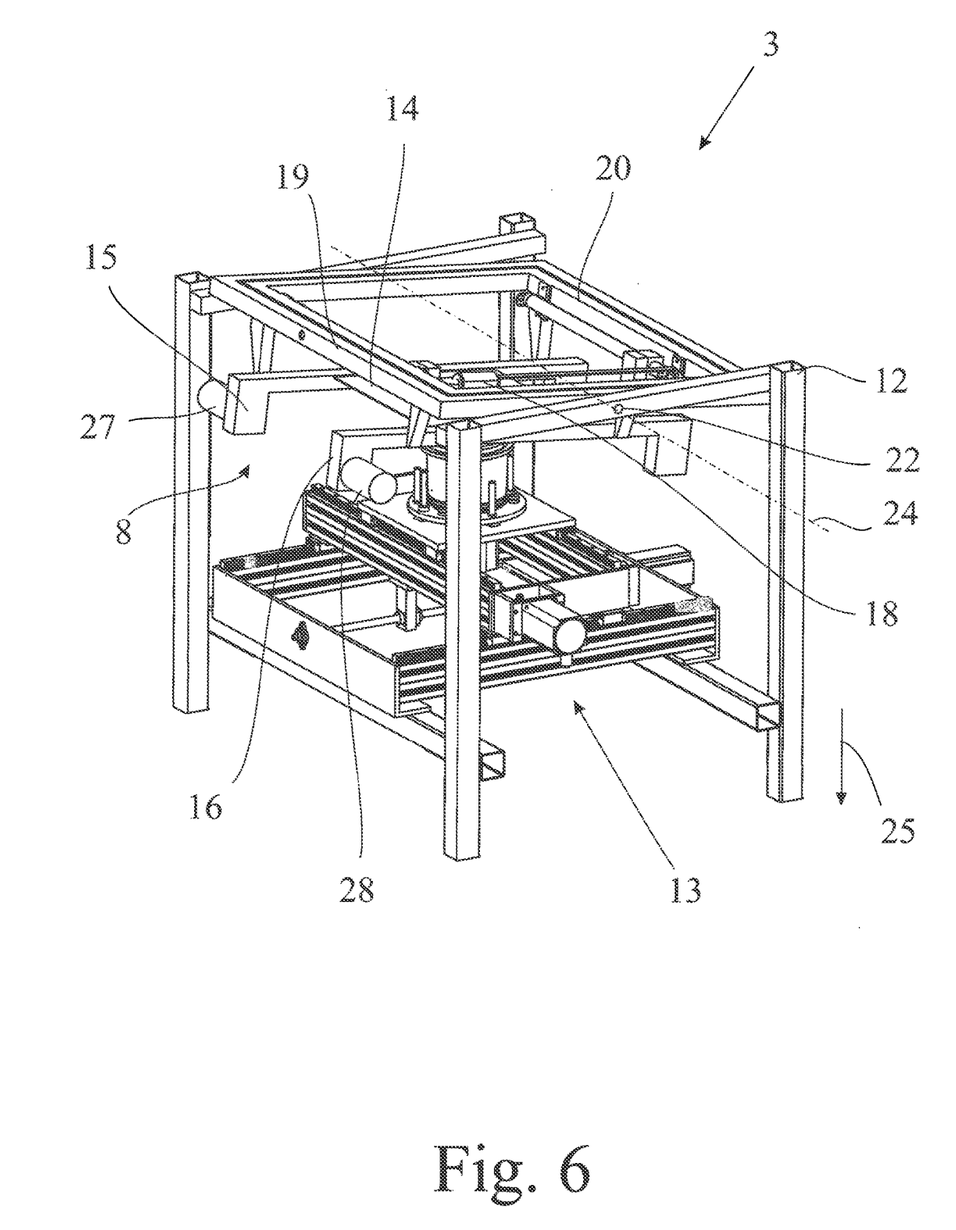
FIG. 6 shows the soldering module according to FIG. 4 in a second tilted position of the linear conveyor.

In contrast to the soldering module 3 depicted in FIG. 5, in the case of the soldering module 3 shown in FIG. 6, the linear conveyor has been tilted about a second tilting axis 24. The second tilting axis 24 extends in this case perpendicularly to the direction of gravitational force 25 and the conveying direction 26. On account of the tilting, the normal of the circuit board 14 encloses an angle of 11° with the direction of gravitational force.

Figure 7:
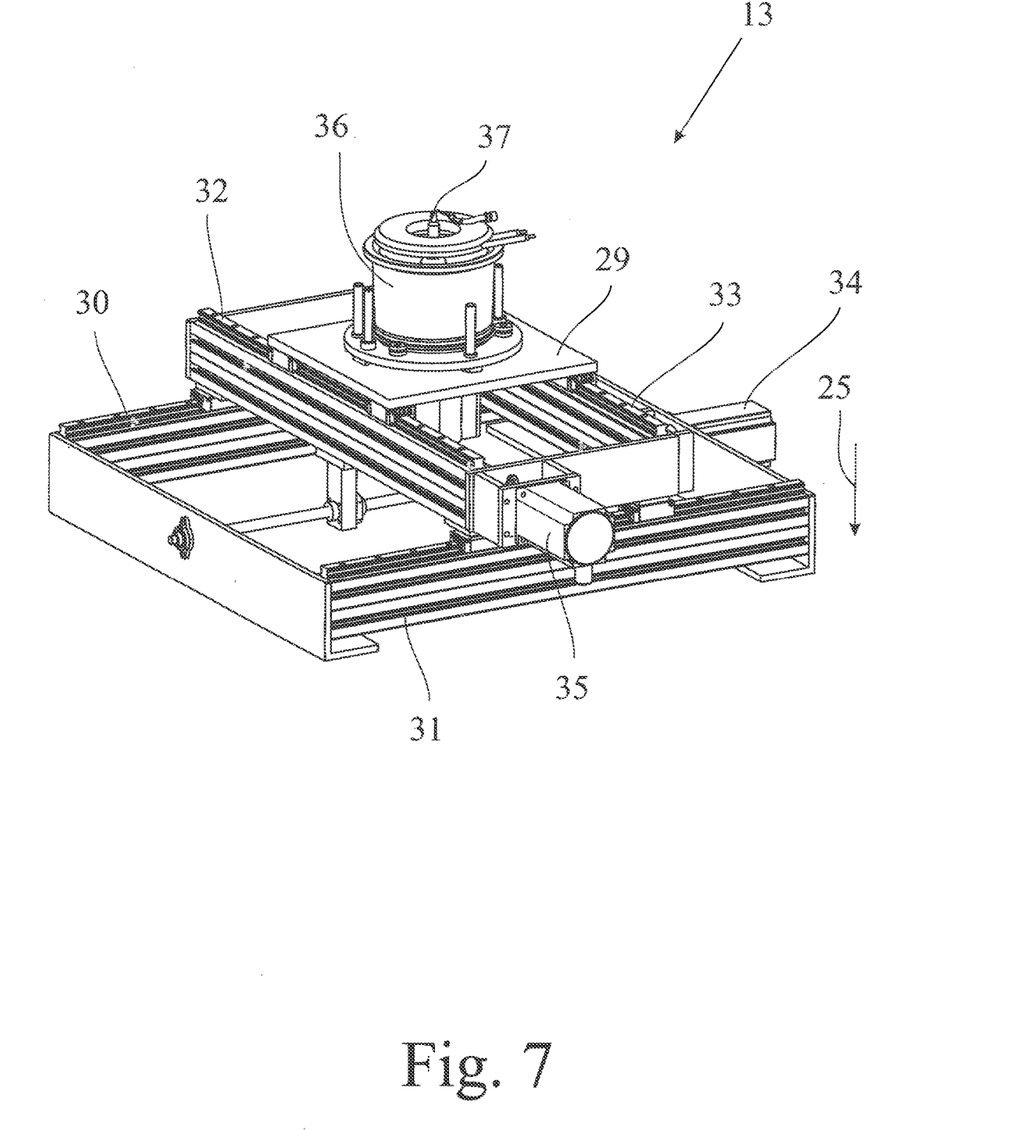
FIG. 7 shows the soldering module according to FIG. 4 in a first disassembled state.

FIG. 7 shows a soldering unit 13 of the soldering module 3 according to FIG. 4. The soldering unit 13 has a table 29. The table 29 is displaceable in a plane perpendicular to the direction of gravitational force 25 by rails 30, 31 and 32, 33, respectively, and motors 34, 35. Provided on the table 29 is a solder container 36 having a soldering nozzle 37.

Figure 8:
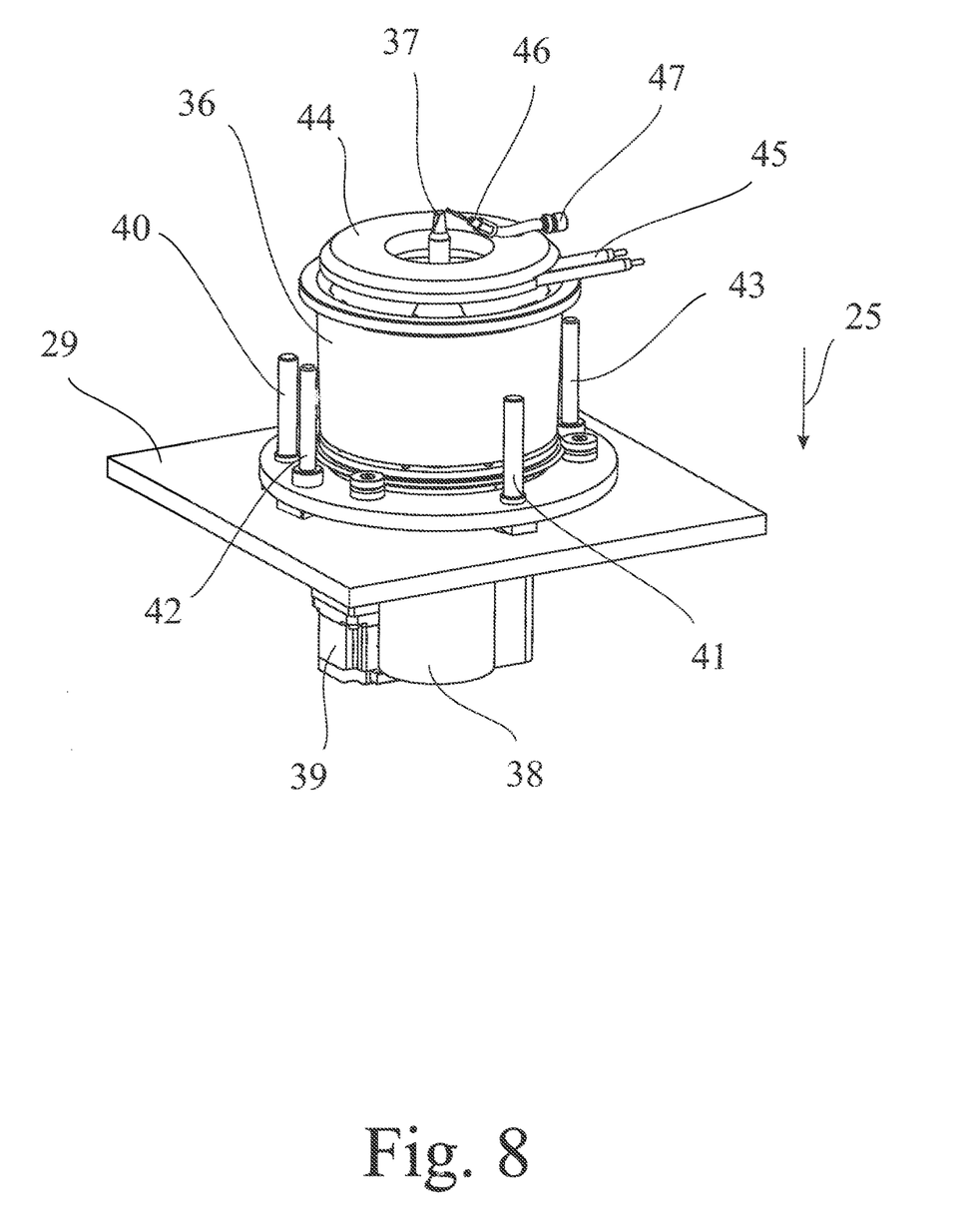
FIG. 8 shows the soldering module according to FIG. 4 in a second disassembled state.

FIG. 8 shows merely the table 29 with the solder container 36 of the soldering module 3. Arranged in the middle of the solder container 65 is a soldering nozzle 37. The solder liquefied in the solder container 36 can be pumped through the soldering nozzle 66 by means of a pump 38 such that a solder wave forms at the tip thereof. Also provided is a motor 39, by way of which the solder container 65 (and the soldering nozzle 66) can be rotated about an axis oriented parallel to the direction of gravitational force 25. By way of three spindles, of which only two spindles 40, 41 are visible, the solder container 65 (and the soldering nozzle 66) can be raised or lowered in the direction of gravitational force 25. In this case, the solder container 65 can be guided by way of two guides 42, 43. Provided above the solder container 65 is a heating element 44, which covers the solder container 65 in the manner of a lid, wherein an opening for the soldering nozzle 66 remains in the middle. The heating element 44 has two power connections 45. Also provided is a solder joint processing device having a gas nozzle 46. Via a connection 47, an inert gas, in particular nitrogen, can be supplied. By way of the heating element 44, the inert gas can be heated and blown onto the solder joint via the gas nozzle 46 so that more selective application of solder as possible. Likewise, it is possible by way of the gas nozzle 46 to ensure that the solder passed through the soldering nozzle runs off in a deliberate manner on the side opposite the gas nozzle 46. Preferably, the gas nozzle 46 is oriented counter to the conveying direction of a linear conveyor for a circuit board.

The invention claimed is:

1. A soldering module for the soldering of components to a circuit board, having a soldering nozzle for creating a solder wave,
    the soldering module comprising a linear conveyor including one of a belt conveyor and a chain conveyor, for applying solder to the circuit board by moving the circuit board in a conveying direction over the solder wave, and in that the linear conveyor is tiltable about a first tilting axis,
    wherein the first tilting axis is oriented substantially perpendicularly to a direction of gravitational force and substantially perpendicularly to a conveying direction or substantially parallel to the conveying direction,
    wherein the linear conveyor is tiltable about a second tilting axis, wherein the second tilting axis is oriented substantially normal to the direction of gravitational force, and
    wherein the first tilting axis and/or the second tilting axis extends through the solder wave.

2. The soldering module as claimed in claim 1, wherein the linear conveyor is tiltable about the first tilting axis such that the normal of the circuit board encloses an angle of at least 4°, of at least 8°, or of at least 10°, with the direction of gravitational force.

3. The soldering module as claimed in claim 1, wherein the linear conveyor is tiltable while the circuit board is being moved over the solder wave.

4. The soldering module as claimed in claim 1, wherein a soldering nozzle is movable in a plane oriented substantially normal to the direction of gravitational force.

5. The solder module as claimed in claim 4, wherein a distance between the soldering nozzle and the circuit board is sellable by moving the soldering nozzle.

6. The soldering module as claimed in claim 4, wherein the soldering nozzle is rotatable.

7. The soldering module as claimed in claim 4, wherein the soldering nozzle is wettable with solder, and is manufactured from steel.

8. The soldering module as claimed in claim 4, wherein the soldering nozzle is not wettable with solder, and is manufactured from a stainless, coated, steel.

9. The soldering module as claimed in claim 1, wherein the soldering module has an inert gas device.

10. The soldering module as claimed in claim 1, wherein provision is made of a solder joint processing device, wherein the solder joint processing device comprises a gas nozzle.

11. The soldering module as claimed in claim 4, wherein the soldering module has a second soldering nozzle for creating a second solder wave.

12. A soldering plant having a first soldering module as claimed in claim 1 and a flux module.

13. The soldering plant as claimed in claim 12, wherein the soldering plant has a preheating module.

14. The soldering plant as claimed in claim 12, wherein the soldering plant has a second soldering module.

15. A method for soldering components to a circuit board using a soldering module as claimed in claim 1, wherein a populated circuit board is received on the linear conveyor, wherein the linear conveyor is in a receiving position, in that the linear conveyor is tilted into a first processing position, in that the circuit board is moved over a first solder wave by means of the linear conveyor, wherein a subregion of the circuit board is wetted with solder.

* * * * *